United States Patent [19]
Tanaka

[11] Patent Number: 5,825,699
[45] Date of Patent: Oct. 20, 1998

[54] SEMICONDUCTOR MEMORY DEVICE FIXING DEFECTIVE MEMORY CELL SELECTION LINE REPLACED WITH SPARE MEMORY CELL SELECTION LINE IN NON-SELECTED STATE

[75] Inventor: Shinji Tanaka, Hyogo, Japan

[73] Assignee: Mitsubishi Denki Kabushiki Kaisha, Tokyo, Japan

[21] Appl. No.: 917,927

[22] Filed: Aug. 27, 1997

[30] Foreign Application Priority Data

Jan. 31, 1997 [JP] Japan ................................. 9-019081

[51] Int. Cl.⁶ ............................................ G11C 7/00
[52] U.S. Cl. ........................ 365/200; 365/205; 365/207; 365/226
[58] Field of Search ............................ 365/200, 205, 365/207, 226

[56] References Cited

U.S. PATENT DOCUMENTS 4,074,237  2/1978  Spampinato .
5,255,228  10/1993  Hatta et al. .............................. 365/200
5,274,594  12/1993  Yanagisawa et al. ................... 365/200
5,363,331  11/1994  Matsui et al. .
5,579,266  11/1996  Tahara ..................................... 365/200
5,666,315  9/1997  Tsukude et al. ........................ 365/200

FOREIGN PATENT DOCUMENTS 4-183000  11/1990  Japan .

Primary Examiner—David C. Nelms
Assistant Examiner—VanThu Nguyen
Attorney, Agent, or Firm—McDermott, Will & Emery

[57] ABSTRACT

In a DRAM, an N-channel MOS transistor is connected between a forward end portion of each column selection-line and a signal transmission line for transmitting a sense amplifier driving signal. The N-channel MOS transistor is brought into a conducting state in a period when the signal goes low for activation and a column decoder is inactivated. Thus, a disconnected defective column selection line can be prevented from being charged at a high level and causing a malfunction of the DRAM. Further, no specific line of a ground potential GND may be provided for the N-channel MOS transistor dissimilarly to the prior art, whereby the layout area can be reduced.

6 Claims, 6 Drawing Sheets

FIG. 3
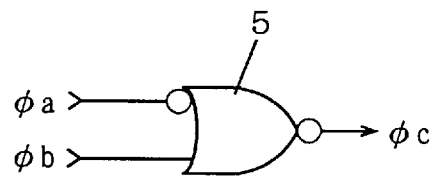
FIG. 4A  φa 
FIG. 4B  φb 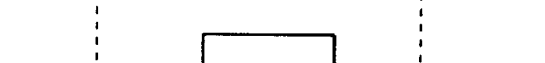
FIG. 4C  SE 
FIG. 4D  /SE 
FIG. 4E  φc 
t1  t2  t3  t4
TIME t →

FIG. 5
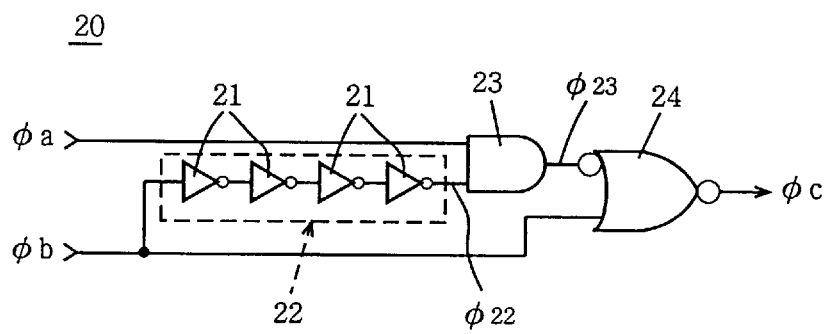
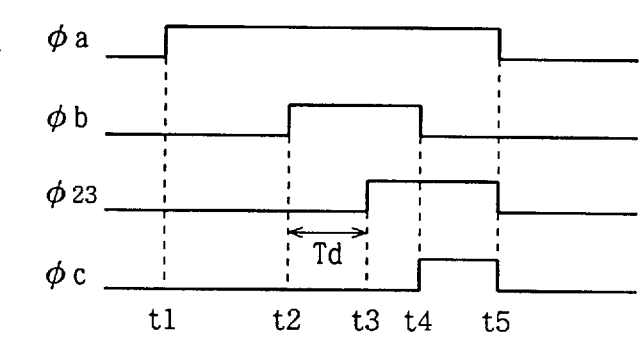
FIG. 6A  φa
FIG. 6B  φb
FIG. 6C  φ23
FIG. 6D  φc
TIME t →

SEMICONDUCTOR MEMORY DEVICE FIXING DEFECTIVE MEMORY CELL SELECTION LINE REPLACED WITH SPARE MEMORY CELL SELECTION LINE IN NON-SELECTED STATE

BACKGROUND OF THE INVENTION

1. Field of the Invention

The present invention relates to a semiconductor memory device. More specifically, the present invention relates to a semiconductor memory device fixing a defective column selection line replaced with a spare column selection line or a defective word line replaced with a spare word line in a non-selected state.

2. Description of the Background Art

FIG. 8 is a block diagram showing the structure of a conventional semiconductor memory device 50. Referring to FIG. 8, this semiconductor memory device 50 comprises a memory mat 51, a row decoder 52, a spare row decoder 53, a column decoder 54, and a spare column decoder 55.

The memory mat 51 includes a plurality of memory cells (not shown) which are arranged in the form of a matrix, word lines WL provided in correspondence to the respective rows, and column selection lines CSL provided in correspondence to the respective columns. The memory mat 51 further includes a plurality of spare memory cell rows (not shown), a plurality of spare memory cell columns (not shown), spare word lines SWL provided in correspondence to the respective spare memory rows, and spare column selection lines SCSL provided in correspondence to the respective spare memory cell columns.

The row decoder 52 selects one of the plurality of word lines WL in accordance with a row address signal RA, and brings up the selected word line WL to a high level for selection. Any defective word line WL is replaced with a spare word line SWL. When a row address signal RA corresponding to the defective word line WL is inputted, the row decoder 52 selects no defective word line WL but the spare row decoder 53 selects the spare word line SWL replacing the defective word line WL, for bringing up the selected spare word line SWL to a high level for selection.

The column decoder 54 selects one of the plurality of column selection lines CSL in accordance with a column address signal CA, and brings up the selected column selection line CSL to a high level for selection. Any defective column selection line CSL is replaced with a spare column selection line SCSL. When a column address signal CA corresponding to the defective column selection line CSL is inputted, the column decoder 54 selects no defective column selection line CSL but the spare column decoder 55 selects the spare column selection line SCSL replacing the defective column selection line CSL, for bringing up the selected spare column selection line SCSL to a high level for selection.

A memory cell or a spare memory cell corresponding to both of the word line WL or the spare word line SWL which is brought up to a high level and the column selection line CSL or the spare column selection line SCSL which is brought up to a high level is selected for transmitting/receiving data to/from the exterior.

Thus, the defective word line WL replaced with the spare word line SWL is fixed at a low level for non-selection, and the defective column selection line CSL replaced with the spare column selection line SCSL is also fixed at a low level for non-selection.

If the defective word or column selection line WL or CSL is disconnected halfway, however, a part floating due to the disconnection cannot be fixed at a low level for non-selection. Thus, the floating part disadvantageously goes high and the memory cell specified by the address signals RA and CA cannot be correctly selected, leading to a malfunction. Further, such a defect cannot be inspected by a general shipping test but requires specific inspection.

To this end, there has been proposed a method of connecting an N-channel MOS transistor 56 between a forward end portion of each column selection line CSL and a line 58 of the ground potential GND, inverting a column decoder activation signal Øb for activating the column decoder 54 through an invertor 57, and supplying the inverted signal to the gate of the N-channel MOS transistor 56, as shown in FIG. 9.

In this case, each column selection line CSL is grounded through the corresponding N-channel MOS transistor 56 in inactivation of the column decoder 54, whereby a part of the column selection line CSL beyond a disconnected portion B can be prevented from being charged to a high level, and the semiconductor memory device 50 can be prevented from a malfunction.

In the method shown in FIG. 9, however, the line 58 of the ground potential GND must be newly provided in the memory mat 51, and hence the layout area is disadvantageously increased.

SUMMARY OF THE INVENTION

Accordingly, a principal object of the present invention is to provide a semiconductor memory device which causes no malfunction even if a defective memory cell selection line replaced with a spare memory cell selection line is disconnected, and can reduce the layout area.

In a semiconductor memory device according to an aspect of the present invention, briefly stated, a connection circuit for preventing a forward end portion of a defective memory selection line from entering a floating state is connected between the forward end portion of the memory cell selection line and a second power supply line for a sense amplifier. Thus, the semiconductor memory device may not be provided with a specific power supply line for the connection circuit dissimilarly to the prior art, whereby the layout area can be reduced.

In a semiconductor memory device according to another aspect of the present invention, briefly stated, a connection circuit for preventing a forward end portion of a defective column selection line from entering a floating state is connected between the forward end portion of the column selection line and a second power supply line for a sense amplifier. Thus, the semiconductor memory device may not be provided with a specific power supply line for the connection circuit dissimilarly to the prior art, whereby the layout area can be reduced.

Preferably, a column selection circuit is activated by a first activation signal for a first period. The semiconductor memory device further includes a sense amplifier driving circuit for supplying first and second potentials to first and second power supply lines respectively by a second activation signal for a second period which is longer than the first period for activating the sense amplifier, and a signal generator circuit generating a third activation signal which is brought to an activation potential on the basis of the first and second activation signals only for a third period in the second period excluding the first period. The connection circuit is brought into a conducting state on the basis of the third activation signal only for the third period. In this case, the connection circuit is allowed to conduct on the basis of the first activation signal for activating the column selection circuit and the second activation signal for activating the sense amplifier, whereby the connection circuit can be readily controlled.

More preferably, the connection circuit is brought into a conducting state after the sense amplifier is activated, the column selection circuit is activated and further inactivated. Therefore, the sense amplifier can be prevented from a malfunction caused by change of the potential of the second power supply line resulting from connection with the column selection line in an initial stage of amplification of the sense amplifier.

In a semiconductor memory device according to still another aspect of the present invention, briefly stated, a first electrode of a connection circuit for preventing a forward end portion of a defective memory cell selection line from entering a floating state is connected to the forward end portion of the memory cell selection line, while a second electrode thereof is connected to a second electrode of at least a single other connection circuit. The second electrode of the connection circuit is in a floating state when the connection circuit is in a nonconducting state. In this case, the semiconductor memory device may not be provided with a specific power supply line for bringing the second electrode of the connection circuit to a second potential, whereby the layout area can be reduced.

In a semiconductor memory device according to a further aspect of the present invention, briefly stated, a first electrode of a connection circuit for preventing a forward end portion of a defective column selection line from entering a floating state is connected to the forward end portion of the column selection line, while a second electrode thereof is connected to a second electrode of at least a single other connection circuit. The second electrode of the connection circuit is in a floating state when the connection circuit is in a non-conducting state. In this case, the semiconductor memory device may not be provided with a specific power supply line for bringing the second electrode of the connection circuit to a second potential, whereby the layout area can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a circuit block diagram showing the structure of a control circuit shown in FIG. 1;

FIGS. 4A–4E are timing charts showing the operation of the DRAM shown in FIG. 1;

FIG. 5 is a circuit block diagram showing the structure of a DRAM according to an embodiment 2 of the present invention;

FIGS. 6A–6D are timing charts showing the operation of a control circuit shown in FIG. 5;

DESCRIPTION OF THE PREFERRED EMBODIMENTS

Embodiment 1

Figure 1:
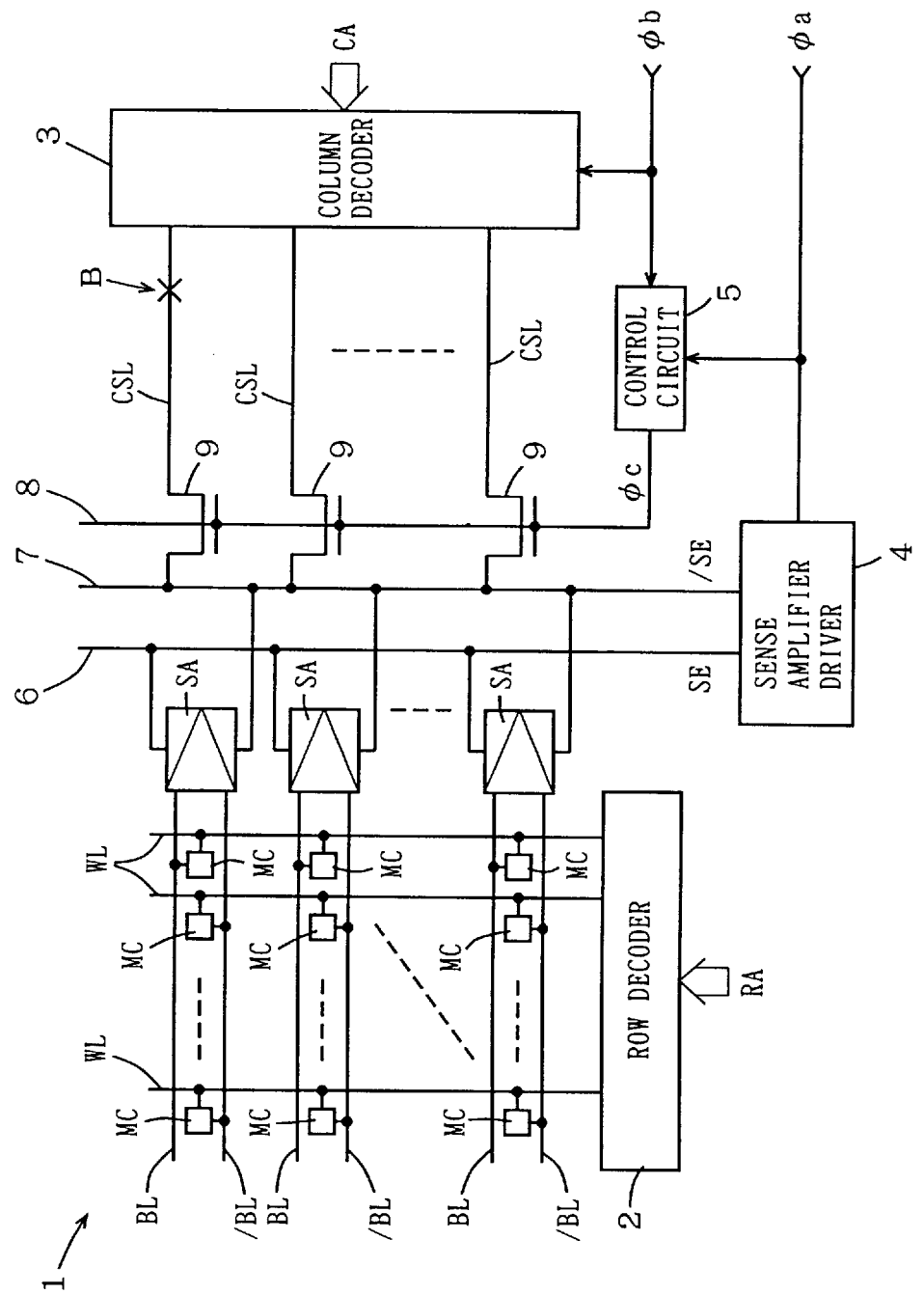
FIG. 1 is a partially omitted circuit block diagram showing the structure of a DRAM according to an embodiment 1 of the present invention.
Figure 2:
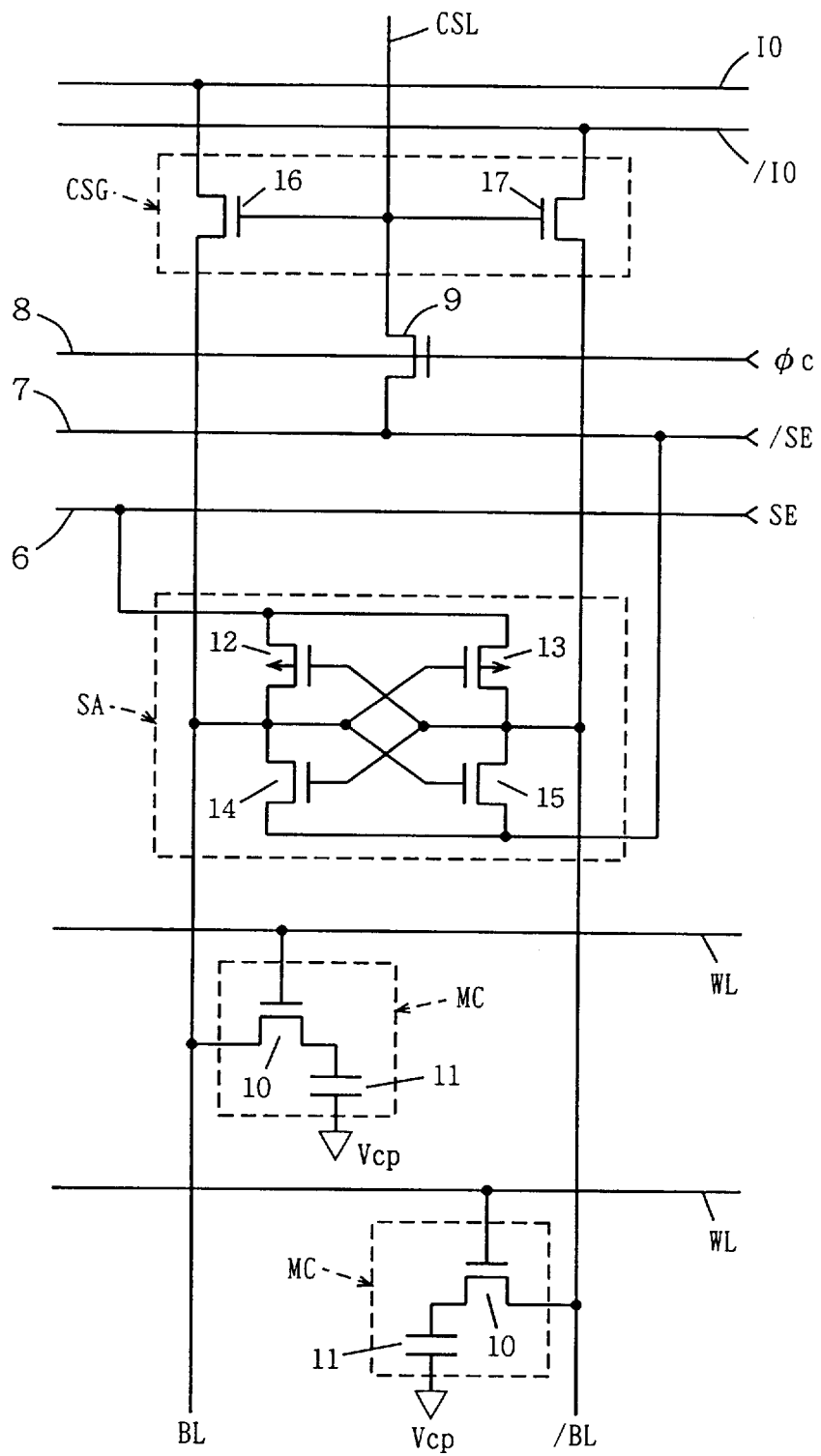
FIG. 2 is a circuit diagram showing a part related to one column of the DRAM shown in FIG. 1 in detail.

FIG. 1 is a partially omitted circuit block diagram showing the structure of a DRAM according to an embodiment 1 of the present invention, and FIG. 2 is a circuit diagram showing a part related to one column of the DRAM shown in FIG. 1 in detail.

Referring to FIGS. 1 and 2, this DRAM comprises a memory array 1, a row decoder 2, a column decoder 3, a sense amplifier driver 4, a control circuit 5, signal transmission lines 6 to 8, and a data input/output line pair IO and /IO. The DRAM further comprises sense amplifiers SA, N-channel MOS transistors 9, column selection lines CSL and column selection gates CSG which are provided in correspondence to respective columns.

The memory array 1 includes a plurality of memory cells MC which are arranged in the form of a matrix, word lines WL provided in correspondence to the respective rows, and bit line pairs BL and /BL provided in correspondence to the respective columns. Each memory cell MC includes an N-channel MOS transistor 10 for access and a capacitor 11 for storing information.

A first end of each word line WL is connected to the row decoder 2. First ends of each bit line pair BL and /BL are connected to the data input/output line pair IO and /IO through a pair of N-channel MOS transistors 16 and 17 forming each column selection gate CSG. The data input/output line pair IO and /IO is connected to a data input/output circuit (not shown). The gates of the N-channel MOS transistors 16 and 17 are connected to the column decoder 3 through each column selection line CSL. Each N-channel MOS transistor 9 is connected between the gates of the N-channel MOS transistors 16 and 17 and the signal transmission line 7, and its gate is connected to the control circuit 5 through the signal transmission line 8.

Each sense amplifier SA includes P-channel MOS transistors 12 and 13 which are connected between the bit lines BL and /BL and the signal transmission line 6 respectively, and N-channel MOS transistors 14 and 15 which are connected between the bit lines BL and /BL and the signal transmission line 7 respectively. The gates of the MOS transistors 13 and 15 are connected to the bit line BL, while those of the MOS transistors 12 and 14 are connected to the bit line /BL. The signal transmission lines 6 and 7 are connected to the sense amplifier driver 4.

The row decoder 2 selects one of the plurality of word lines WL in accordance with a row address signal RA, and brings up the selected word line WL to a high level for selection. Thus, the N-channel MOS transistor 10 of each memory cell MC connected to the selected word line WL conducts, to activate each memory cell MC.

The column decoder 3 is activated in response to activation of a column decoder activation signal Øb at a high level, for selecting one of the plurality of column selection lines CSL excluding a defective selection line which is replaced with a spare column selection line, and bringing up the selected column selection line CSL to a high level for selection. Thus, the column selection gate CSG which is connected with the selected column selection line CSL conducts, so that a data signal can be inputted/outputted between each activated memory cell MC and the exterior.

In response to activation of a sense amplifier activation signal Øa at a high level, the sense amplifier driver 4 brings up the potential (signal SE) of the signal transmission line 6 from an intermediate level to a high level while bringing down the potential (signal /SE) of the signal transmission line 7 from an intermediate level to a low level, for driving each sense amplifier SA.

As shown in FIG. 3, the control circuit 5 is formed by a gate circuit having an output node whose potential (signal Øc) goes high only when the sense amplifier activation signal Øa goes high for activation and the column decoder activation signal Øb goes low for inactivation. Therefore, the N-channel MOS transistor 9 conducts only when the signal transmission line 7 goes low and no column selection line CSL is brought up to a high level by the column decoder 3, for fixing a part of the column selection line CSL between a disconnected portion B and the forward end at a low level.

FIGS. 4A–4E are timing charts showing the operation of the DRAM shown in FIGS. 1 to 3. After a bit line equalizer circuit (not shown) equalizes the bit lines BL and /BL at an intermediate level, the row decoder 2 brings up the word line WL of a row corresponding to the row address signal RA to a high level for selection. The potentials of the bit lines BL and /BL are slightly changed in response to the charge quantity of the capacitor 11 of the activated memory cell MC.

At a time t1, the sense amplifier activation signal Øa goes high for activation and the sense amplifier driving signals SE and /SE go high and low respectively in response, for activating the sense amplifier SA. When the potential of the bit line BL is only slightly higher than that of the bit line /BL, the resistance values of the MOS transistors 12 and 15 become smaller than those of the MOS transistors 13 and 14, to bring up and down the potentials of the bit lines BL and /BL to high and low levels respectively. When the potential of the bit line /BL is only slightly higher than that of the bit line BL, on the other hand, the resistance values of the MOS transistors 13 and 14 become smaller than those of the MOS transistors 12 and 15, to bring up and down the potentials of the bit lines /BL and BL to high and low levels respectively. At the time t1, further, the signal Øc rises to a high level, the MOS transistor 9 conducts, and the forward end portion of the column selection line CSL is fixed at a low level.

At a time t2, the column decoder activation signal Øb rises to a high level for activation, whereby the signal Øc falls to a low level, and the MOS transistor 9 enters a non-conducting state. At the same time, the column decoder 3 brings up the column selection line CSL of the column corresponding to the column address signal CA to a high level for selection, and allows the column selection gate CSG of the column to conduct. Data of the bit line pair BL and /BL of the selected column are supplied to the data input/output circuit (not shown) through the column selection gate CSG and the data input/output line pair IO and /IO, and outputted from the data input/output circuit to the exterior.

At a time t3, the column decoder activation signal Øb falls to a low level for inactivation, whereby the column decoder 3 is inactivated to bring down all column selection lines CSL to a low level for non-selection. At the same time, the signal Øc is brought up to a high level, the MOS transistor 9 conducts, and the forward end of the column selection line CSL is fixed at a low level.

At a time t4, the sense amplifier activation signal Øa falls to a low level for inactivation, whereby the signal Øc goes low and the MOS transistor 9 enters a non-conducting state. At the same time, the sense amplifier driving signals SE and /SE enter an intermediate level, for completing a read operation.

According to this embodiment, the N-channel MOS transistor 9 for preventing any disconnected column selection line CSL from entering a floating state is connected between the forward end of the column selection line CSL and the signal transmission line 7 for transmitting the sense amplifier driving signal /SE. Thus, no specific line 58 of the ground potential GND may be provided for the N-channel MOS transistor 9 dissimilarly to the prior art, whereby the layout area can be reduced.

While the N-channel MOS transistor 9 is connected between each column selection line CSL and the signal transmission line 7 for preventing any disconnected column selection line CSL from entering a floating state according to this embodiment, such an N-channel MOS transistor 9 may also be connected between each word line WL and the signal transmission line 7 for preventing any disconnected word line WL from entering a floating state, as a matter of course.

While the embodiment has been described with reference to a semiconductor memory device formed by a DRAM, the present invention is not restricted to this but is also applicable to any semiconductor memory device comprising column selection lines, row selection lines and sense amplifiers, as a matter of course.

Embodiment 2

FIG. 5, which is compared with FIG. 3, is a circuit diagram showing the structure of a control circuit 20 of a DRAM according to an embodiment 2 of the present invention.

Referring to FIG. 5, this control circuit 20 includes a delay circuit 22 which is formed by an even number (four in FIG. 5) of serially connected invertors 21, an AND gate 23, and a gate circuit 24. A sense amplifier activation signal Øa is inputted in one input node of the AND gate 23, while a column decoder activation signal Øb is inputted in another input node of the AND gate 23 through the delay circuit 22. The gate circuit 24 has an output node whose potential (signal Øc) goes high only when an output signal Ø23 of the AND gate 23 goes high and the column decoder activation signal Øb goes low for inactivation.

FIGS. 6A–6D are timing charts showing the operation of the control circuit 20 shown in FIG. 5. In an initial state, the sense amplifier activation signal Øa, the column decoder activation signal Øb, the output signal Ø23 of the AND gate 23 and the signal Øc are at low levels. The sense amplifier activation signal Øa rises to a high level for activation at a time t1, while the signal Ø23 remains low and the signal Øc also remains unchanged since the column decoder activation signal Øb is at a low level.

At a time t2, the column decoder activation signal Øb rises to a high level for activation. After a lapse of a delay time Td of the delay circuit 22, an output signal Ø22 of the delay circuit 22 rises to a high level at a time t3, and the output signal Ø23 of the AND gate 23 also rises to a high level in response.

At a time t4, the column decoder activation signal Øb falls to a low level for inactivation, whereby the signal Øc rises to a high level. At a time t5, the sense amplifier activation signal Øa falls to a low level for inactivation, whereby the signals Ø23 and Øc also fall to low levels. The remaining structure and operation of this embodiment are identical to those of the DRAM according to the embodiment 1, and hence redundant description is omitted.

According to this embodiment, the potential of a signal transmission line 7 fluctuates due to connection with a column selection line CSL in an initial stage of amplification of a sense amplifier SA, whereby the sense amplifier SA can be prevented from occurrence of a malfunction.

Embodiment 3

Figure 7:
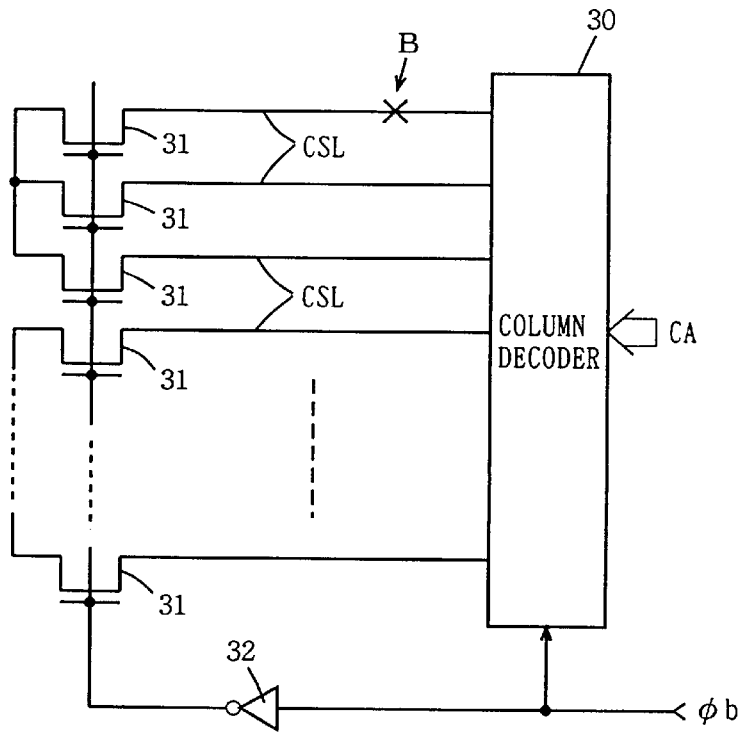
FIG. 7 is a circuit block diagram showing a principal part of a DRAM according to an embodiment 3 of the present invention.
Figure 8:
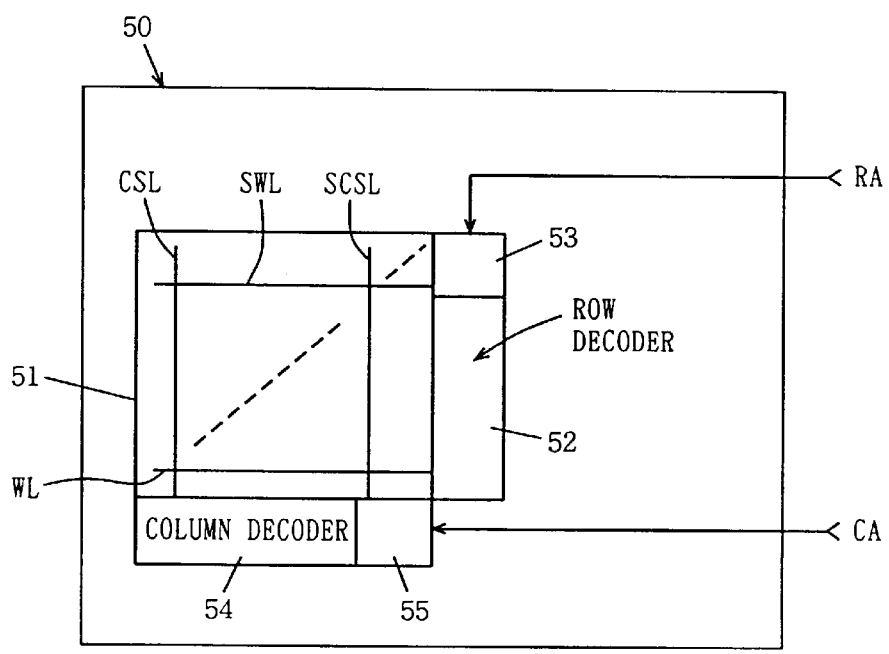
FIG. 8 is a partially omitted block diagram showing the structure of a conventional DRAM.
Figure 9:
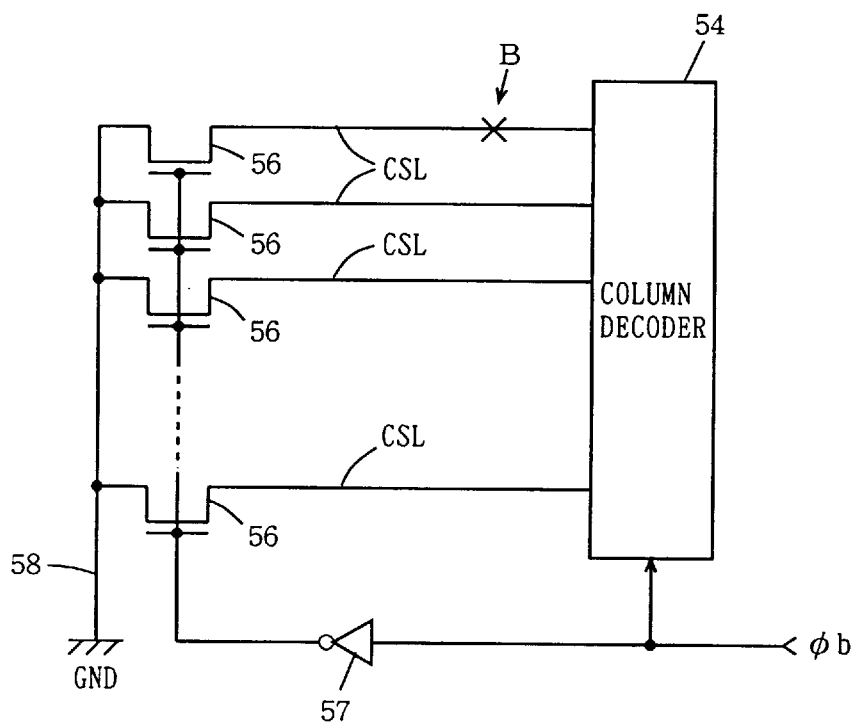
FIG. 9 is a partially omitted circuit block diagram showing exemplary improvement of the DRAM shown in FIG. 8.

FIG. 7, which is compared with FIG. 9, is a circuit diagram showing a principal part of a DRAM according to an embodiment 3 of the present invention.

Referring to FIG. 7, this DRAM includes a column decoder 30, column selection lines CSL which are provided in correspondence to respective columns, N-channel MOS transistors 31 which are provided in correspondence to the respective columns, and an invertor 32.

The column decoder 30 is activated by a column decoder activation signal Øb, and selects one of the column selection lines CSL excluding a defective column selection line which is replaced with a spare column selection line. The selected column selection line CSL is brought up to a high level, while the remaining column selection lines CSL are maintained at low levels.

First electrodes of the N-channel MOS transistors 31 are connected to forward ends of the corresponding column selection lines CSL respectively. Second electrodes of three adjacent N-channel MOS transistors 31 are connected with each other. The column decoder activation signal Øb is inputted in the gate of each N-channel MOS transistor 31 through the invertor 32.

When the column decoder activation signal Øb enters a high level for activation, an output of the invertor 32 goes low and each N-channel MOS transistor 31 enters a non-conducting state. At the same time, the column decoder 30 is activated for bringing up the column selection line CSL corresponding to a column address signal CA to a high level for selection.

When the column decoder activation signal Øb is brought down to a low level for inactivation, the column decoder 30 is inactivated and all column selection lines CSL are maintained at low levels for non-selection. At the same time, an output of the invertor 32 goes high and the N-channel MOS transistors 31 conduct. A part of a defective column selection line CSL beyond a disconnected portion B is connected to the adjacent normal column selection line CSL through two N-channel MOS transistors 31, and maintained at a low level for non-selection by the column decoder 30. Thus, the forward end portion of the defective column selection line CSL can be prevented from being charged at a high level and causing a malfunction in the DRAM.

According to this embodiment, no specific line 58 of the ground potential GND may be provided for the N-channel MOS transistors 31 dissimilarly to the conventional DRAM shown in FIG. 9, whereby the layout area can be reduced as compared with the conventional DRAM.

While the N-channel MOS transistor 31 is connected to the forward end portion of each column selection line CSL in this embodiment, the present invention is not restricted to this but the N-channel MOS transistor 31 may alternatively be connected to a central portion or each of a plurality of portions of the column selection line CSL.

While the second electrodes of the three adjacent N-channel MOS transistors 31 are connected with each other in this embodiment, the second electrodes of two or at least four N-channel MOS transistors 31 may alternatively be connected with each other.

While the N-channel MOS transistors 31 connect adjacent pairs of column selection lines CSL with each other for preventing any disconnected column selection line CSL from entering a floating state in this embodiment, such N-channel MOS transistors 31 may also connect adjacent pairs of word lines WL with each other, for preventing any disconnected word line WL from entering a floating state.

While this embodiment has been described with reference to a semiconductor memory device formed by a DRAM, the present invention is not restricted to this but is also applicable to any semiconductor memory device comprising column selection lines, row selection lines (word lines) and sense amplifiers, as a matter of course.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising a memory array including a plurality of memory cells and a plurality of memory cell selection lines being provided in correspondence to said plurality of memory cells respectively for fixing a defective memory cell selection line being replaced with a spare memory cell selection line in a non-selected state, said semiconductor memory device further comprising:

memory cell selection means being connected with first end portions of said plurality of memory cell selection lines for selecting one of said plurality of memory cell selection lines excluding said defective memory cell selection line in accordance with an address signal, bringing selected said memory cell selection line to a first potential while maintaining remaining said memory cell selection lines at a second potential, and activating a memory cell corresponding to said selected memory cell selection line;

first and second power supply lines receiving said first and second potentials respectively;

a sense amplifier being connected with said first and second power supply lines for amplifying a data signal being read from said memory cell being activated by said memory cell selection means; and connection means being provided in correspondence to each said memory cell selection line and connected between a second end portion of corresponding said memory cell selection line and said second power supply line to be brought into a conducting state in a prescribed period other than a period for bringing said memory cell selection line being selected by said memory cell selection means to said first potential.

2. A semiconductor memory device comprising a memory array including a plurality of memory cells being arranged in the form of a matrix, word lines being provided in correspondence to respective rows, and bit line pairs being provided in correspondence to respective columns, and column selection lines being provided in correspondence to respective said bit line pairs for fixing a defective column selection line being replaced with a spare column selection line in a non-selected state, said semiconductor memory device further comprising:

row selection means for selecting any said word line of said memory array in accordance with a row address signal and activating memory cells corresponding to selected said word line;

column selection means being connected to first end portions of said column selection lines for selecting one of a plurality of said column selection lines excluding said defective column selection line in accordance with a column address signal, bringing selected said column selection line to a first potential while maintaining remaining said column selection lines at a second potential, and selecting a bit line pair corresponding to said selected column selection line;

first and second power supply lines receiving said first and second potentials respectively;

a sense amplifier being connected with said first and second power supply lines for amplifying a slight potential difference being read from said memory cell being activated by said row selection means on said bit line pair being selected by said column selection means to the difference between said first and second potentials; and connection means being provided in correspondence to each said column selection line and connected between a second end portion of corresponding said column selection line and said second power supply line to be brought into a conducting state in a prescribed period other than a period for bringing said column selection line being selected by said column selection means to said first potential.

3. The semiconductor memory device in accordance with claim 2, wherein said column selection means receives a first activation signal, to be activated only in a first period when said first activation signal is at an activation potential, said semiconductor memory device further comprising:

sense amplifier driving means receiving a second activation signal for supplying said first and second potentials to said first and second power supply lines respectively and activating said sense amplifier only for a second period, being longer than said first period, when said second activation signal is at an activation potential, and signal generator means receiving said first and second activation signals for outputting a third activation signal being at an activation potential only for a third period in said second period excluding said first period, said connection means receiving said third activation signal being outputted from said signal generator means to be brought into a conducting state only in said third period.

4. The semiconductor memory device in accordance with claim 3, wherein said third period is a period of said second period after completion of said first period.

5. A semiconductor memory device comprising a memory array including a plurality of memory cells and a plurality of memory cell selection lines being provided in correspondence to said plurality of memory cells respectively for fixing a defective memory cell selection line being replaced with a spare memory cell selection line in a non-selected state, said semiconductor memory device further comprising:

memory cell selection means being connected to first end portions of said plurality of memory cell selection lines for selecting one of said plurality of memory cell selection lines excluding said defective memory cell selection line in accordance with an address signal, bringing selected said memory cell selection line to a first potential while maintaining remaining said memory cell selection lines at a second potential, and activating a memory cell corresponding to said selected memory cell selection line, a sense amplifier for amplifying a data signal being read from said memory cell being activated by said memory cell selection means, and connection means being provided in correspondence to each said memory cell selection line, having a first electrode being connected to a second end portion of corresponding said memory cell selection line, and being brought into a conducting state in a period other than a period for bringing said memory cell selection line being selected by said memory cell selection means to said first potential, a second electrode of said connection means being connected to a second electrode of at least a single other connection means, brought to said second potential by said memory cell selection means in said period when said connection means is brought into a conducting state, and brought into a floating state in a period when said connection means is brought into a non-conducting state.

6. A semiconductor memory device comprising a memory array including a plurality of memory cells being arranged in the form of a matrix, word lines being provided in correspondence to respective rows and bit line pairs being provided in correspondence to respective columns, and column selection lines being provided in correspondence to respective said bit line pairs for fixing a defective column selection line being replaced with a spare column selection line in a non-selected state, said semiconductor memory device further comprising:

row selection means selecting any said word line of said memory array in accordance with a row address signal and activating memory cells corresponding to selected said word line;

column selection means being connected to first end portions of said column selection lines for selecting any said column selection line of said memory array excluding said defective column selection line in accordance with a column address signal, bringing selected said column selection line to a first potential while maintaining remaining said column selection lines at a second potential, and selecting a bit line pair corresponding to said selected column selection line;

a sense amplifier for amplifying a data signal being read from said memory cell being activated by said row selection means on said bit line pair being selected by said column selection means; and connection means being provided in correspondence to said column selection means and having a first electrode being connected to a second end portion of corresponding said column selection line to be brought into a conducting state in a period other than a period for bringing said column selection line being selected by said column selection means to said first potential, a second electrode of said connection means being connected to a second electrode of at least a single other connection means, brought to said second potential by said column selection means in said period when said connection means is brought into a conducting state, and brought into a floating state in a period when said connection means is brought into a non-conducting state.

* * * * *